(12) United States Patent
Anazawa

(10) Patent No.: US 7,005,887 B2
(45) Date of Patent: Feb. 28, 2006

(54) SEMICONDUCTOR INTEGRATED CIRCUIT

(75) Inventor: Tetsuya Anazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 32 days.

(21) Appl. No.: 10/787,764

(22) Filed: Feb. 27, 2004

(65) Prior Publication Data
US 2004/0174755 A1 Sep. 9, 2004

(30) Foreign Application Priority Data
Mar. 6, 2003 (JP) ............................. 2003-059834

(51) Int. Cl.
H03K 19/177 (2006.01)
(52) U.S. Cl. ............................ 326/38; 326/41; 257/203
(58) Field of Classification Search ............ 326/38–41, 326/101; 257/202, 203
See application file for complete search history.

(56) References Cited

U.S. PATENT DOCUMENTS

| 5,300,796 A * | 4/1994 | Shintani ...................... 257/203 |
| 6,721,933 B1 * | 4/2004 | Iwasa ........................... 716/10 |
| 6,836,026 B1 * | 12/2004 | Ali et al. ...................... 257/786 |
| 2003/0057549 A1 * | 3/2003 | Sei .............................. 257/723 |

FOREIGN PATENT DOCUMENTS

| JP | 56-140647 | 11/1981 |
| JP | 11-150204 | 6/1999 |

* cited by examiner

Primary Examiner—Don Le
(74) Attorney, Agent, or Firm—Arent Fox, PLLC.

(57) ABSTRACT

A semiconductor integrated circuit is provided, which includes a first group of cells, in which a plural of I/O cells and/or power source cells for external input and/or output are arranged along a direction of the outer periphery of the semiconductor integrated circuit, and a second group of cells on an inner side of the first group of cells in which a plural of I/O cells and/or power source cells for external input and/or output are arranged along a direction of the outer periphery of the semiconductor integrated circuit. The intervals between the cells forming the second group of cells are wider than those between the cells forming the first group of cells.

23 Claims, 8 Drawing Sheets

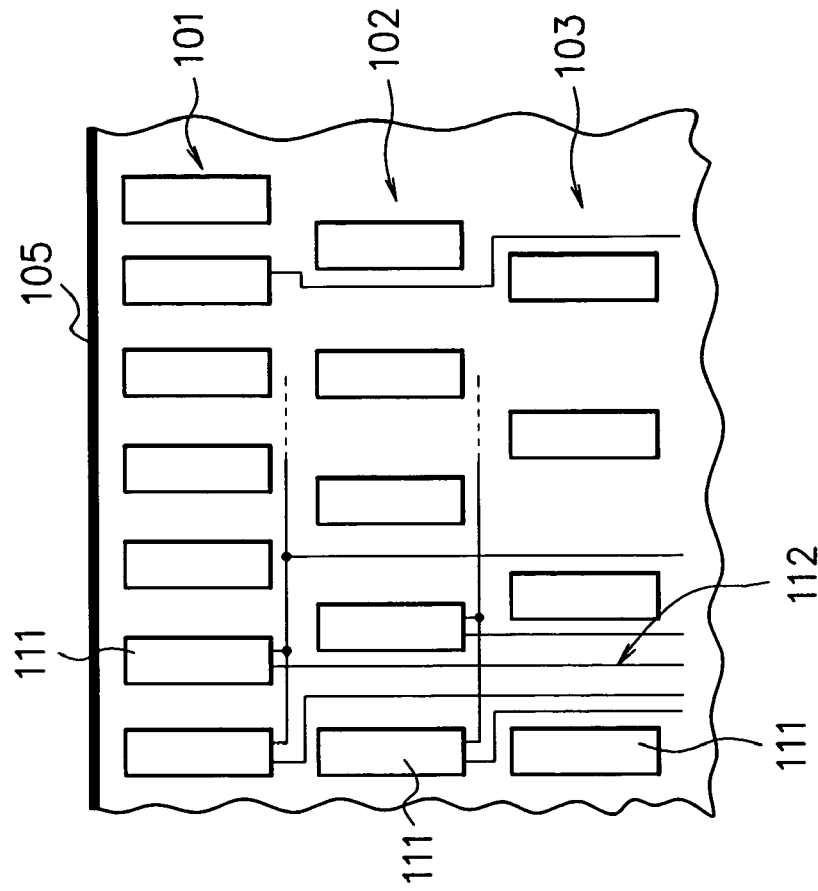
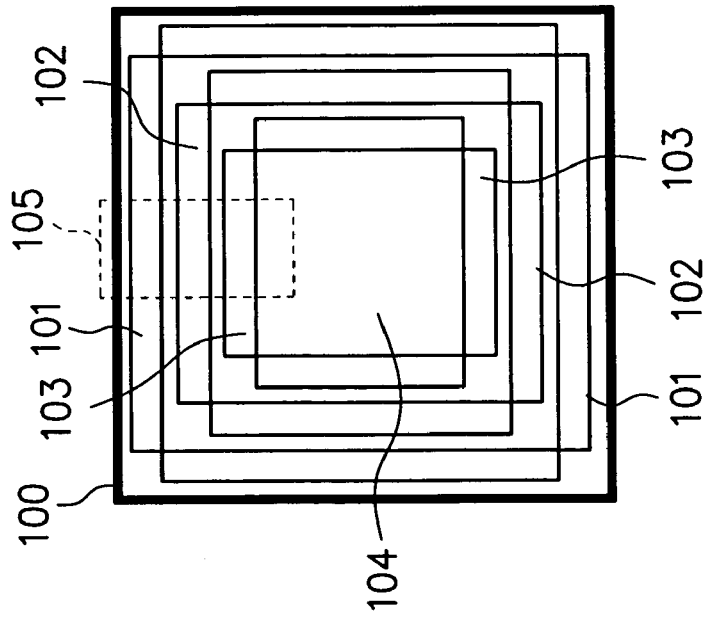

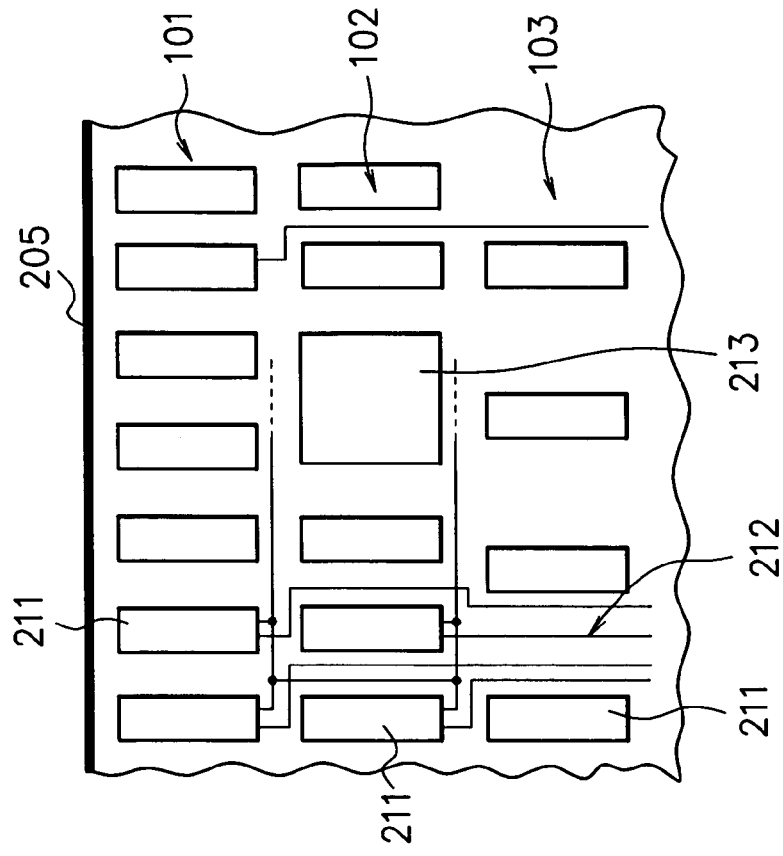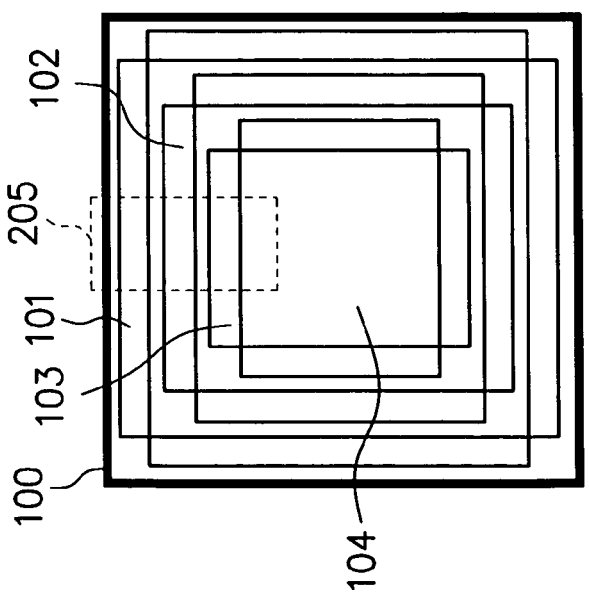

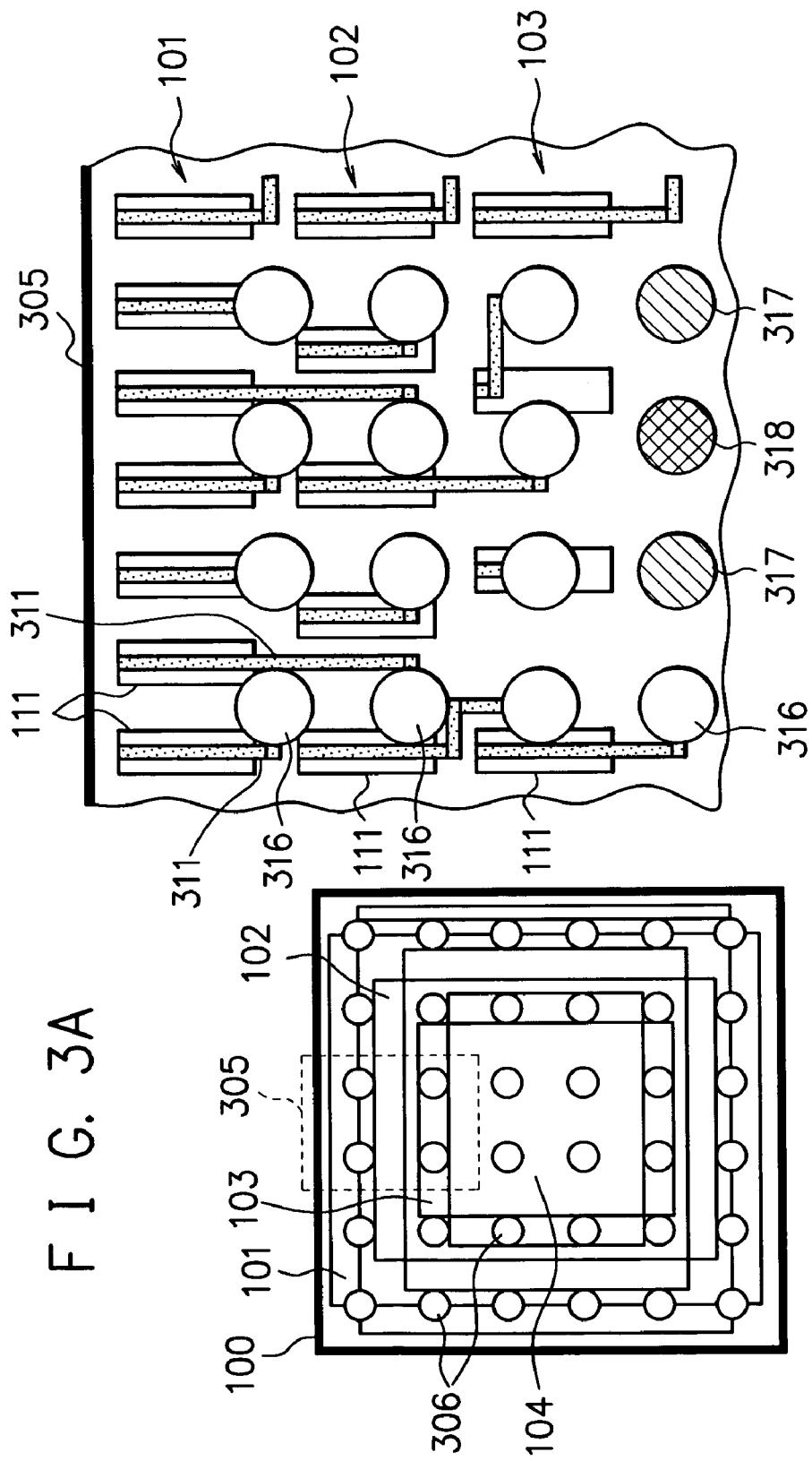

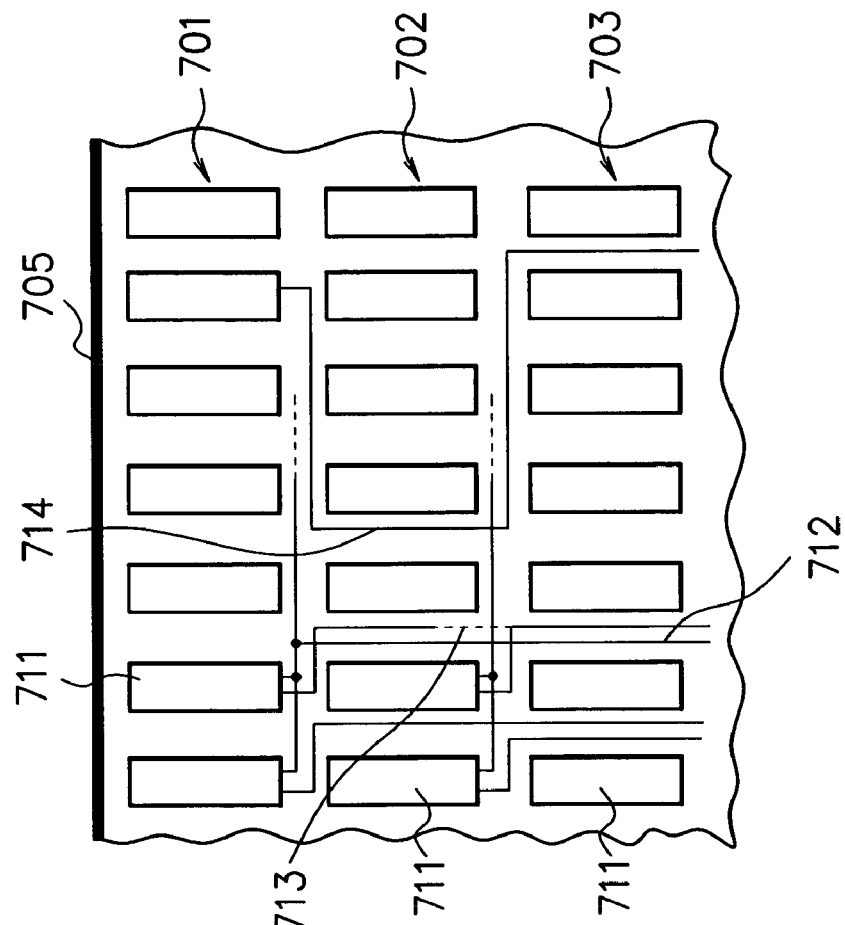
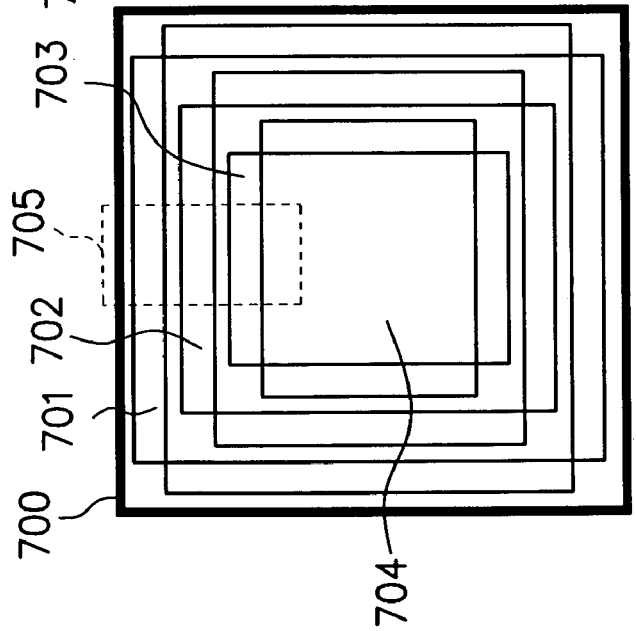
FIG. 7B PRIOR ART
FIG. 7A PRIOR ART

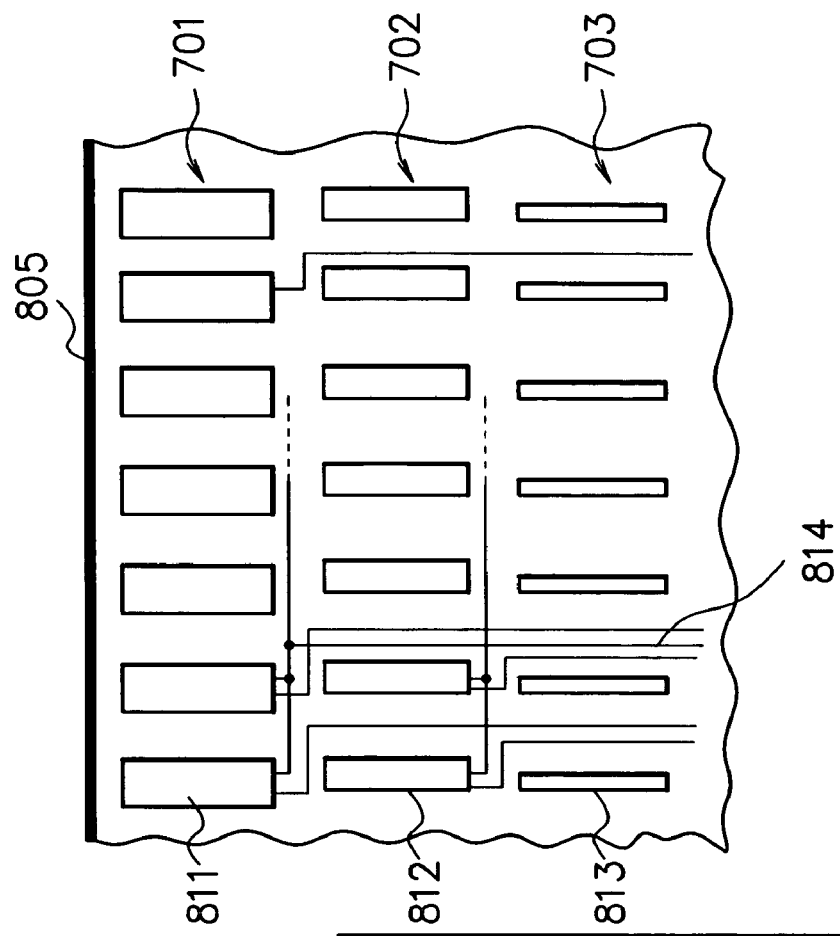
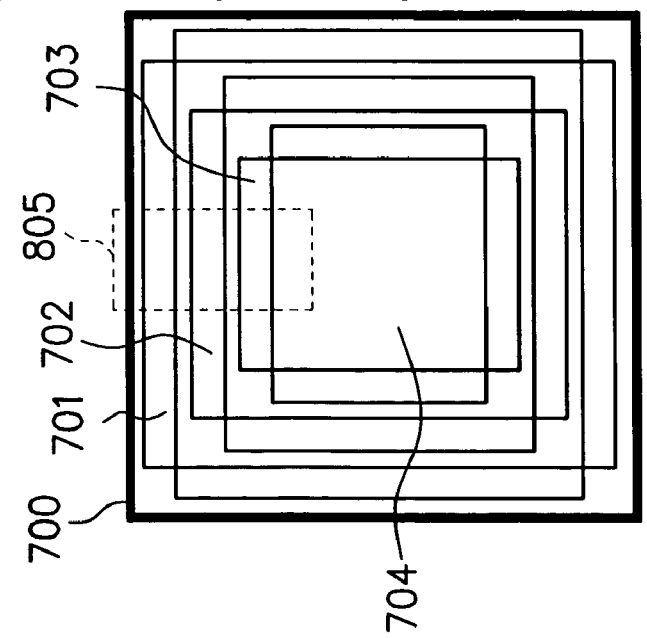
FIG. 8B PRIOR ART
FIG. 8A PRIOR ART

SEMICONDUCTOR INTEGRATED CIRCUIT

CROSS-REFERENCE TO RELATED APPLICATIONS

This application is based upon and claims the benefit of priority from the prior Japanese Patent Application No. 2003-059834, filed on Mar. 6, 2003, the entire contents of which are incorporated herein by reference.

BACKGROUND OF THE INVENTION

1. Field of the Invention

This invention relates to a semiconductor integrated circuit and, more particularly, to a semiconductor integrated circuit having input/output (I/O) cells and/or power source cells.

2. Description of the Related Art

In a semiconductor integrated circuit, I/O cells are often arranged in multistage in order to cope with the multiplication of pins. The arrangement intervals for I/O cells in a multistage configuration are such that both outer I/O cells and inner I/O cells are arranged at predetermined intervals.

FIGS. 7A and 7B show a semiconductor integrated circuit having a configuration in which I/O cells are arranged in multistage according to a first prior art.

FIG. 7A shows a configuration of a semiconductor integrated circuit (semiconductor chip) 700. The semiconductor integrated circuit 700 has a first group of cells 701, a second group of cells 702, and a third group of cells 703 along the circumferential frame region thereof, and effective circuit cells in an internal region 704. Respective plural I/O cells of the first to the third group of cells 701 to 703 are arranged annularly along a direction of the outer periphery. The first group of cells 701, the second group of cells 702, and the third group of cells 703 are, respectively, the outermost group of cells, the second outermost group of cells, and the third outermost group of cells, in the semiconductor integrated circuit 700.

FIG. 7B is an enlarged view of a region 705 which is a part of the semiconductor integrated circuit shown in FIG. 7A. The region 705 includes the first group of cells 701, the second group of cells 702, and the third group of cells 703. In each group of cells 701 to 703, a plurality of I/O cells 711 are disposed. In this configuration, the size and the arrangement interval of the I/O cells 711 are constant. The I/O cells 711 are hard-wired with the cells within the internal region 704 (FIG. 7A). Hence, the more innerly a group of cells is located, the more difficult is the wiring between the I/O cells 711 in the wire region 712 therein. For example, in the case of a wire 713, wiring is impractical because there is no wiring channel remaining. Even when wiring is coaxed, a long detour is required so that the wire has to be longer in length. Further, as is the case with the wire region 712, the more innerly a group of cells is located, the more congested the wiring is, becoming more susceptible to crosstalk. In the worst case thereof, a required performance cannot be achieved.

FIGS. 8A and 8B show a semiconductor integrated circuit having a configuration in which I/O cells are arranged in multistage according to a second prior art. FIG. 8A shows the configuration of a semiconductor integrated circuit 700 as in FIG. 7A. FIG. 8B is an enlarged view of a region 805 which is a part of the semiconductor integrated circuit shown in FIG. 8A. The region 805 includes a first group of cells 701, a second group of cells 702, and a third group of cells 703. In the first group of cells 701, a plurality of I/O cells 811 are arranged. In the second group of cells 702, a plurality of I/O cells 812 each of them being smaller than the I/O cell 811 in size are arranged. In the third group of cells 703, I/O cells 813 each of them being smaller than the I/O cell 812 in size are arranged. The number of cells for the groups of cells 701 to 703 is identical.

In the above configuration, the more innerly a group of cells is located, the smaller is the size of I/O cells thereof. Accordingly, as seen in a wiring region 814, the wiring region is wide enough so that there is no wiring difficulty. However, since the more innerly located group of cells includes the smaller I/O cells, a large variety of types of I/O cells having the same function have to be prepared, costing an enormous number of man-hours for the development. Further, there is a problem that in general, the electrostatic withstand voltage of the smaller I/O cells are lower where the structure of the transistors are uniform.

Still another prior art is also published in the following patent document 1.

[Patent Document 1]

Japanese Patent Laid-open No. Hei 11-150204

SUMMARY OF THE INVENTION

It is an object of the present invention to eliminate wiring congestion in a wiring region in an innerly arranged group of I/O cells of a semiconductor integrated circuit, in which I/O cells are configured in multistage.

It is another object of the present invention to prevent lowering of the electrostatic withstand voltage of the I/O cells of the semiconductor integrated circuit in which the I/O cells are configured in multistage.

It is still another object of the present invention to reduce the number of man-hours for developing the I/O cell of the semiconductor integrated circuit in which the I/O cells are configured in multistage.

According to one aspect of the present invention, provided is a semiconductor integrated circuit including: a first group of cells in which I/O cells for external input and/or output and/or power source cells are plurally arranged along the direction of the outer periphery; and a second group of cells arranged on an inner side of the first group of cells in which I/O cells for external input and/or output and/or power source cells are plurally arranged along the direction of the outer periphery. The intervals between the cells forming the second group of cells are wider than those between the cells forming the first group of cells.

In the present invention, the intervals between the cells forming the second group of cells are wider than those between the cells forming the first group of cells, so that wiring congestion in a wiring region of an innerly disposed group of cells can be eliminated. Further, when the number of the cells forming the second group of cells is made less than that of the cells forming the first group of cells, the size of the cells of the second group does not need to be reduced. Accordingly, lowering of the electrostatic withstand voltage of the I/O cells and/or power source cells can be prevented. Furthermore, the size of the cells forming the second group of cells can be made identical to that of the cells forming the first group of cells, which reduces the number of the man-hour for developing the I/O cells and/or power source cells.

BRIEF DESCRIPTION OF THE DRAWINGS

FIGS. 1A and 1B illustrate a semiconductor integrated circuit in which I/O cells and/or power source cells configured in multistage are arranged according to a first embodiment of the present invention;

FIGS. 2A and 2B illustrate a semiconductor integrated circuit in which I/O cells and/or power source cells configured in multistage are arranged according to a second embodiment of the present invention;

FIGS. 3A and 3B illustrate a semiconductor integrated circuit in which I/O cells and/or power source cells configured in multistage are arranged according to a third embodiment of the present invention;

FIGS. 7A and 7B illustrate a semiconductor integrated circuit in which a multistage-configured I/O cells are arranged according to a first prior art; and FIGS. 8A and 8B illustrate diagrams showing a semiconductor integrated circuit in which a multistage-configured I/O cells are arranged according to a second prior art.

DETAILED DESCRIPTION OF THE PREFERRED EMBODIMENTS

First Embodiment

Figure 4:
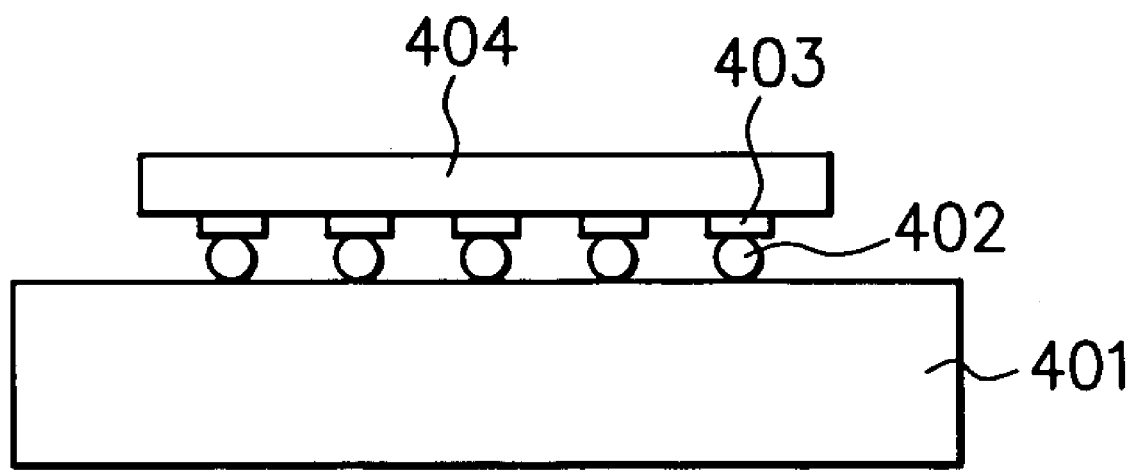
FIG. 4 is a sectional view of a semiconductor integrated circuit having an area bump configuration.

FIGS. 1A and 1B show a semiconductor integrated circuit in which I/O cells and/or power source cells configured in multistage are arranged according to a first embodiment of the present invention.

FIG. 1A shows a configuration of a semiconductor integrated circuit (semiconductor chip) 100. The semiconductor integrated circuit 100 includes a first group of cells 101, a second group of cells 102, and a third group of cells 103, along the circumferential frame region thereof, and innerly disposed circuit cells in an internal region 104 thereof. In each of the first to third groups of cells 101 to 103, respective plural I/O cells are arranged annularly along a direction of the outer periphery. The first group of cells 101, the second group of cells 102, and the third group of cells 103 are, respectively, the outermost group of cells, the second outermost group of cells, and the third outermost group of cells, in the semiconductor integrated circuit 100.

It should be noted that the groups of cells 101 to 103 are not limited to those formed of I/O cells only, but are formed of I/O cells and/or power source cells. The I/O cell has an input buffer and/or an output buffer to input and/or output signals externally. The power source cell is a cell to connect to an external power source potential or a reference potential. The I/O cell receives power in such a manner that a power source potential line and a reference potential line are supplied from the power source cell. Each group of cells 101 to 103 is annularly connected via power source potential lines and reference potential lines.

FIG. 1B is an enlarged view of a region 105 which is a part of the semiconductor integrated circuit shown in FIG. 1A. The region 105 includes the first group of cells 101, the second group of cells 102, and the third group of cells 103. In each group of cells 101 to 103, plural I/O cells and/or power source cells 111 are arranged. It is a configuration in which the groups of cells are arranged in three stages, and the size of the cell 111 is uniform among the cell groups 101 to 103.

The intervals between the cells 111 of the second group of cells 102 are wider compared to those of the first group of cells, and the number of the cells 111 forming the second group of cells 102 is larger than that of the cells 111 forming the first group of cells 101. Further, the intervals between the cells 111 of the third group of cells 103 are wider than those of the second group of cells 102, and the number of cells 111 forming the third group of-cells 103 is larger than that of the cells 111 forming the second group of cells 102.

In the present embodiment, the more innerly a group of cells is located, the wider are the arrangement intervals for the cells 111 thereof. Such a structure allows a sufficient space of wiring region as seen in a wiring region 112, in which there is no wiring congestion, and a crosstalk because of the wiring can be prevented.

Second Embodiment

FIGS. 2A and 2B show a semiconductor integrated circuit in which I/O cells and/or power source cells configured in multistage are arranged according to a second embodiment of the present invention.

FIG. 2A shows a configuration of a semiconductor integrated circuit 100 which is equivalent to that of the first embodiment as shown in FIG. 1A. FIG. 2B is an enlarged view of a region 205 which is a part of the semiconductor integrated circuit shown in FIG. 2A. The region 205 includes a first group of cells 101, a second group of cells 102, and a third group of cells 103. It is a configuration in which the groups of cells are arranged in three stages, and cells of two different sizes, cells 211 and 213, are included. In the first group of cells 101, the cells 211 of a uniform size are arranged. The second group of cells 102 includes a number of cells 211 among which small number of the cells 213 which are larger than the cells 102 in size exist. Depending upon specifications of a semiconductor integrated circuits, the cells 213 which are large in size may need to be arranged in the second cell group 102. The arrangement intervals of cells are uniform for the first group of cells 101 and the second group of cells 102. In the third cell group 103, the cells 211 are arranged, the size of them being uniform. The intervals between the cells forming the third group of cells 103 are wider than those for the second group of cells 102, and the number of the cells forming the third group of cells 103 are smaller than that of the cells forming the second group of cells 102.

Since no signal wiring to connect to the internal cells is provided on the outer side of the first group of cells 101 disposed outermost, congestion of signal wires does not need to be considered in terms of the arrangement intervals of the cells forming the group of cells 101.

Further, even when the sizes of cells are different, like the cell 211 and the cell 213 which are used herein, the configuration according to the present embodiment allows a sufficient space for the wiring region, as seen in a wiring region 212. While the case of two different sizes of cells, the cell 211 and the cell 213, has been explained as an example of the present embodiment, it is not to mention that the above descriptions apply to the cases of three or more different sizes of cells.

It should be noted that, while in the above example, the arrangement intervals for the group of cells 101 which is outermost disposed and its immediately inner group of cells 102 disposed in the second stage are uniform, the intervals for the second cell group 102 may be wider than those for the group of cells 101.

It should also be noted that in the above-described first and second preferred embodiments, one case is shown where the cell arrangement intervals are fixed for each of the groups of cells 101 to 103, but such cell arrangement intervals does not need to be fixed for each of the groups of cells 101 to 103. In other words, the intervals between the cells 211 in the group of cells 101 do not need to be uniform. As described above, so long as the arrangement intervals are wider for the more innerly located groups of cells, the arrangement intervals for each group of cells does not need to be fixed. Further, in the case of a multistage configuration where there are three or more stages, so long as the intervals for arranging cells for the outermost group of cells 101 and its immediately inner group of cells 102 are uniform, and the intervals for arranging cells for an further inner group of cells which is disposed on the third or later stage are wider than those for the outer group of cells 101 and 102, the cell arrangement intervals do not need to be fixed for each group of cells.

Third Embodiment

FIGS. 3A and 3B show a semiconductor integrated circuit in which I/O cells and/or power source cells configured in multistage are arranged according to a third embodiment of the present invention.

FIG. 3A shows a configuration of a semiconductor integrated circuit 100 which is equivalent to that of the first embodiment shown in FIG. 1A. Over the semiconductor integrated circuit 100, area bumps (metal bumps) 306 are provided, which are two-dimensionally arranged.

FIG. 3B is an enlarged view of a region 305 which is a part of the semiconductor integrated circuit shown in FIG. 3A. The region 305 includes a first group of cells 101, a second group of cells 102, and a third group of cells 103. In each of the groups of cells 101 to 103, plural I/O cells and/or power source cells 111 are arranged whose sizes are uniform for each group of cells as in the first embodiment shown in FIG. 1B. The area bumps 306 disposed over the semiconductor integrated circuit 100 include a signal bump 316, a bump for power source potential 317, and a bump for reference (grand) potential 318.

The semiconductor integrated circuit 100 has pads which dot flatways for connecting to the area bumps 316 to 318. The pads are provided under the bumps 316 to 318. The cells 111 are connected to the bumps 316 to 318 through wires 311 and the pads. The signal bump 316 is connected to the I/O cell through the pad. The bump for power source potential 317 and the bump for reference potential 318 are connected to the power source cells through the pads. The pad may be provided outside or inside of the cell 111.

In case of the area-bump configuration, similarly to the first embodiment, the intervals between the cells 111 of the second group of cells 102 are wider than those between the cells 111 of the first group of cells 101, and the number of the cells 111 forming the second group of the cells 102 is larger than that of the cells 111 forming the first group of cells 101. The intervals between the cells 111 of the third group of cells 103 are wider than those between the cells 111 of the first group of cells 102, and the number of the cells 111 forming the third group of the cells 103 is larger than that of the cells 111 forming the second group of cells 102.

FIG. 4 is a sectional view of the semiconductor integrated circuit of the area-bump structure described above. A semiconductor chip 404 has pads 403. Area bumps 402 are provided between the pads 403 and a base 401 to connect the both.

Fourth Embodiment

Figure 5:
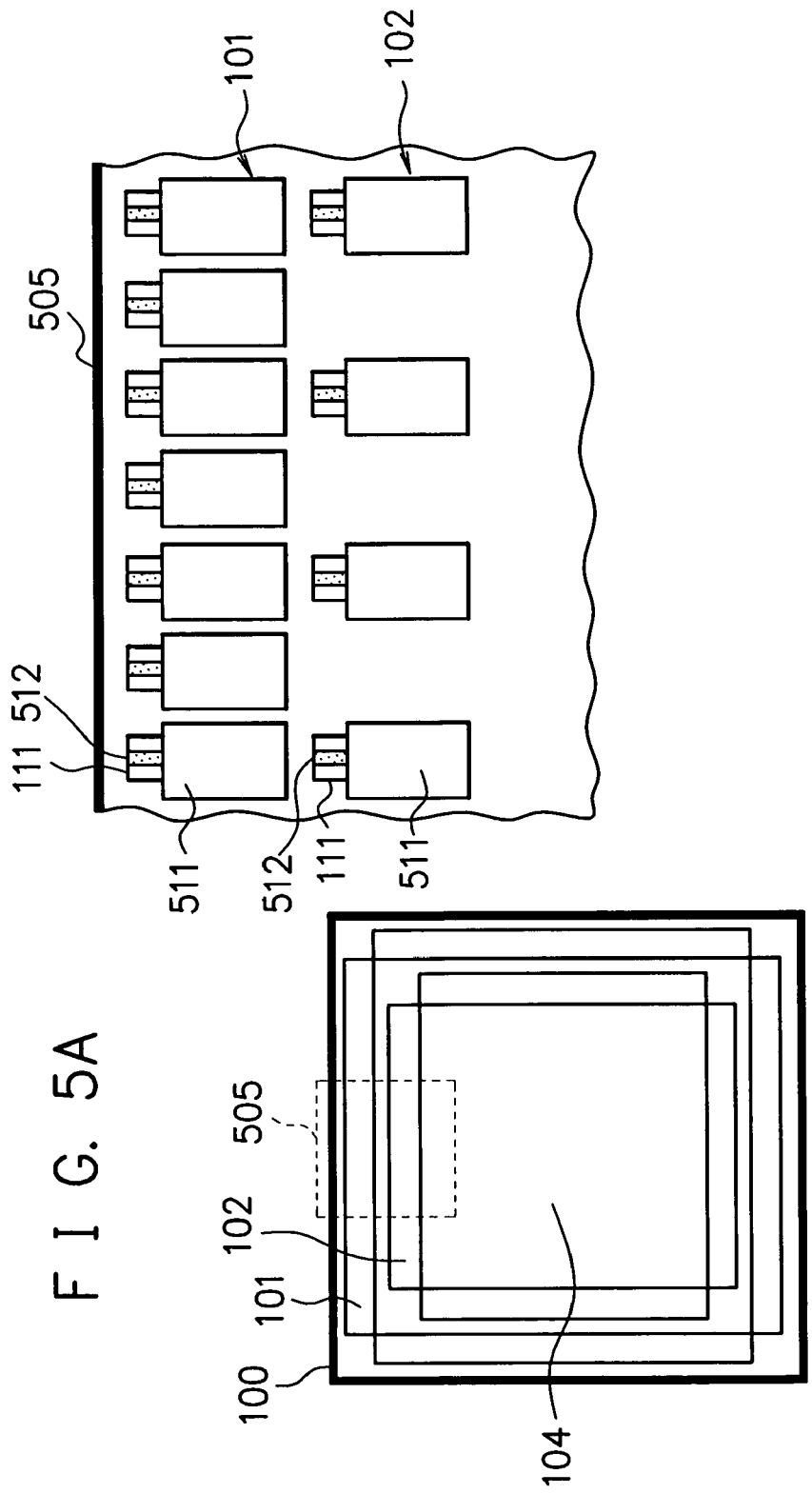
FIGS. 5A and 5B illustrate a semiconductor integrated circuit in which I/O cells and/or power source cells configured in multistage are arranged according to a fourth embodiment of the present invention.

FIGS. 5A and 5B show a semiconductor integrated circuit in which I/O cells and/or power source cells configured in multistage are arranged according to a fourth embodiment of the present invention.

FIG. 5A shows a configuration of a semiconductor integrated circuit 100 which is equivalent to that of the first embodiment, except that it is composed of a first group of cells 101 and a second group of cells 102.

FIG. 5B is an enlarged view of a region 505 which is a part of the semiconductor integrated circuit shown in FIG. 5A. The region 505 includes the first group of cells 101 and the second group of cells 102. In each group of cells 101 and 102, plural I/O cells and/or power source cells 111 are arranged whose sizes are uniform for each group of cells, as in the first embodiment shown in FIG. 1B. A pad 511 may be, for example, a wire-bonding pad, and is provided over the cell 111. The cell 111 is connected to the pad 511 via a wire 512.

In the case of the wire-bonding configuration, similarly to the first embodiment, the intervals between the cells 111 of the second group of cells 102 are wider than those between the cells 111 of the first group of cells, and the number of the cells 111 forming the second group of the cells 102 is larger than that of the cells 111 forming the first group of cells 101.

Figure 6:
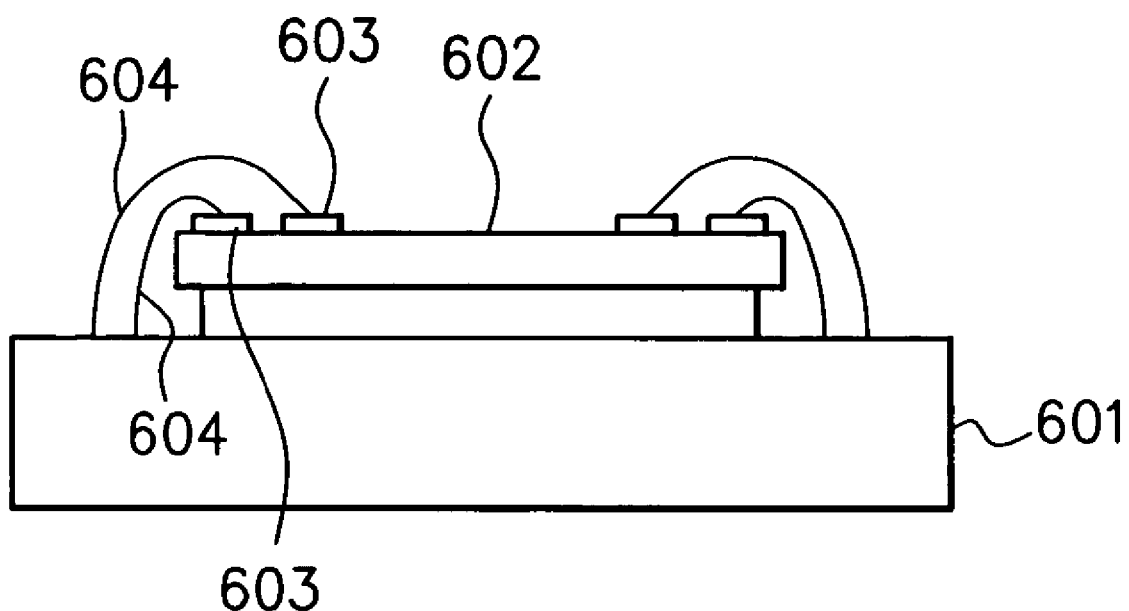
FIG. 6 is a sectional view of a semiconductor integrated circuit of a wire-bonding configuration.

FIG. 6 is a sectional view of a semiconductor integrated circuit of the wire-bonding configuration stated above. A semiconductor chip 602 has bonding pads 603. A metal wire 604 is provided between the pad 603 and a package 601 including leads, to connect them by bonding.

Similarly to the first embodiment, this structure allows the wider arrangement intervals for the more innerly disposed group of cells, so that there is no need to create cells of different sizes for each group of cell. Accordingly, the semiconductor integrated circuit can be configured so as to secure sufficient space for a wiring region. Further, similarly to the second embodiment, in a multistage configuration of cells where there are three or more stages of cells, the group of cells 102 disposed in the second stage on an immediate inner side of the outermost group of cells 101 is defined as a primitive state, so that the arrangement intervals of cells forming a group of cells 103 are made wider than those for its immediately outer group of cells 102.

The above configuration eliminates wiring congestion in a cell-arranged region of the innerly disposed group of cells. Further, not being a configuration in which the smaller cells are fabricated for the more inner group of cells, lowering of the electrostatic withstand voltage of the I/O cells and/or power source cells because of a structural cause can be prevented. Furthermore, not being the configuration in which the smaller cells are fabricated for the more inner group of cells, there is no need to prepare cells of different sizes for each group of cells, whereby the number of the man-hour for development of the I/O cells and/or power source cells is reduced.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As has been described hereinabove, since the intervals between the cells forming the second group of cells are wider than those between the cells forming the first group of cells, wiring congestion in the wiring region of the innerly located groups of cells can be eliminated. Further, where the number of cells of the second group of cells is smaller than that of the first group of cells, there is no need to make the cells of the second group of cells smaller, whereby lowering of the electrostatic withstand voltage of the I/O cells and/or power source cells can be prevented. Furthermore, the size of the cells forming the second group of cells and that of the cells forming the first group of cells can be made uniform, so that the man-hour for developing the I/O cells and/or power source cells can be reduced.

What is claimed is:

1. A semiconductor integrated circuit, comprising:
    a first group of cells, in which a plurality of I/O cells and/or power source cells for external input and/or output are arranged along a direction of outer periphery of said semiconductor integrated circuit; and
    a second group of cells disposed on an inner side of said first group of cells, in which a plurality of I/O cells and/or power source cells for external input and/or output are arranged along a direction of outer periphery of the semiconductor integrated circuit; and
    wherein intervals between cells forming said second group of cells are wider than those between cells forming said first group of cells.

2. The semiconductor integrated circuit according to claim 1, wherein said first group of cells are an outermost group of cells in the semiconductor integrated circuit, and wherein said second group of cells are a second outermost group of cells in the semiconductor integrated circuit.

3. The semiconductor integrated circuit according to claim 1, wherein said first group of cells is a second outermost group of cells in the semiconductor integrated circuit, and a second group of cells is a third outermost group of cells in the semiconductor integrated circuit.

4. The semiconductor integrated circuit according to claim 1, wherein the respective cells of the first and the second groups of cells are arranged annularly.

5. The semiconductor integrated circuit according to claim 1, wherein the cells forming the first group of cells and the cells forming the second group of cells are uniform in size.

6. The semiconductor integrated circuit according to claim 1, wherein the cells forming the first group of cells and the cells forming the second group of cells are partially different in size.

7. The semiconductor integrated circuit according to claim 1, further comprising a pad for external connection, and wherein the cell of the first group of cells and the cell of the second group of cells are connected to said pad.

8. The semiconductor integrated circuit according to claim 7, wherein said pad is provided on an inner side of the cell forming the first group of cells and the cell forming the second group of cells.

9. The semiconductor integrated circuit according to claim 7, wherein said pad is provided on an outer side of the cell forming the first group of cells and the cell forming the second group of cells.

10. The semiconductor integrated circuit according to claim 1, further comprising pads which dot flatways to connect to area bumps.

11. The semiconductor integrated circuit according to claim 1, further comprising a wire-bonding pad over the cell forming the first group of cells and the cell forming second group of cells.

12. The semiconductor integrated circuit according to claim 1, wherein the cell of the first group of cells and the cell of the second group of cells are provided along a frame region of the semiconductor integrated circuit.

13. The semiconductor integrated circuit according to claim 1, wherein said I/O cell has an input buffer and/or an output buffer.

14. The semiconductor integrated circuit according to claim 13, wherein said I/O cell is a cell to input and/or output a signal externally.

15. The semiconductor integrated circuit according to claim 1, wherein said power source cell is a cell to connect to an external power source potential or an external reference potential.

16. The semiconductor integrated circuit according to claim 1, further comprising a third group of cells disposed on an inner side of the second group of cells, in which a plurality of I/O cells and/or power source cells for external input and/or output are arranged along a direction of the outer periphery thereof, and wherein intervals between cells of said third group of cells are wider than those between cells of the second group of cells.

17. The semiconductor integrated circuit according to claim 2, wherein the respective cells of the first group of cells and the second groups of cells are arranged annularly.

18. The semiconductor integrated circuit according to claim 17, wherein the cell of the first group of cells and the cell of the second group of cells are uniform in size.

19. The semiconductor integrated circuit according to claim 18, further comprising a pad for external connection, and wherein the cell of the first group of cells and the cell of the second group of cells are connected to said pad.

20. The semiconductor integrated circuit according to claim 19, wherein said pads are pads dotting flatways to connect to area bumps.

21. The semiconductor integrated circuit according to claim 19, wherein said pad is a wire-bonding pad provided over a cell of the first group of cells and a cell of the second group of cells.

22. The semiconductor integrated circuit according to claim 1, wherein the cells forming the second group of cells are less than the cells forming the first group of cells in number.

23. The semiconductor integrated circuit according to claim 16, wherein the cells forming the third group of cells are less than the cells forming the second group of cells in number.

* * * * *